(12) United States Patent
Sato et al.

(10) Patent No.: US 10,616,389 B2
(45) Date of Patent: Apr. 7, 2020

(54) APPARATUS WITH A CRADLE FOR AN ELECTRONIC DEVICE

(71) Applicant: Panasonic Intellectual Property Management Co., Ltd., Osaka (JP)

(72) Inventors: Takashi Sato, Osaka (JP); Mitsuhiro Tosa, Osaka (JP); Keiichi Taketani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/292,651

(22) Filed: Mar. 5, 2019

(65) Prior Publication Data

US 2019/0281148 A1 Sep. 12, 2019

Related U.S. Application Data

(60) Provisional application No. 62/640,024, filed on Mar. 8, 2018.

(51) Int. Cl.
*H04M 1/06* (2006.01)
*H05K 5/02* (2006.01)
(Continued)

(52) U.S. Cl.
CPC ............ *H04M 1/06* (2013.01); *F16M 11/04* (2013.01); *G06F 1/1632* (2013.01); *H05K 5/023* (2013.01)

(58) Field of Classification Search
CPC combination set(s) only.
See application file for complete search history.

(56) References Cited

U.S. PATENT DOCUMENTS 4,845,738 A * 7/1989 Takano ............... H04M 1/2155
455/569.2
5,305,381 A * 4/1994 Wang .................. B60R 11/0241
379/426

(Continued)

FOREIGN PATENT DOCUMENTS

JP           3296207       6/2002
JP         2003-69682      3/2003

(Continued)

*Primary Examiner* — Lisa Lea-Edmonds
(74) *Attorney, Agent, or Firm* — Wenderoth, Lind & Ponack, L.L.P.

(57) ABSTRACT

An apparatus includes a handset and a cradle that removably holds the handset. In the cradle, the storage section is disposed in the main body, includes a recess formed from a bottom surface, two side surfaces extending along a longitudinal direction, and two end surfaces extending along a lateral direction that crosses the longitudinal direction, and can accommodate the entire length of the handset. The cord insertion portion is open at a first end surface of the two end surfaces. A cord of the electronic terminal passes through the cord insertion portion. The push-up member is disposed so as to retractably project from the bottom surface of the storage section, and abuts against the handset stored in the storage portion. The handset is stored in the storage section so as to form a space between the handset and the bottom surface of the storage section, and can pivot to the first end surface side due to the push-up member projecting.

13 Claims, 11 Drawing Sheets

(51) Int. Cl.
*G06F 1/16* (2006.01)
*F16M 11/04* (2006.01)

(56) References Cited

U.S. PATENT DOCUMENTS

| | | | | |
|---|---|---|---|---|
| 5,652,792 | A * | 7/1997 | Gallagher | H04M 1/06 379/446 |
| 5,832,082 | A * | 11/1998 | Nagai | B60R 11/0241 379/449 |
| 5,865,503 | A * | 2/1999 | Shields, Jr. | B60R 11/0241 297/188.01 |
| 6,002,765 | A * | 12/1999 | Frank | H04M 1/06 379/446 |
| 6,227,505 | B1 * | 5/2001 | Van Order | B60R 11/02 224/549 |
| 6,282,289 | B1 * | 8/2001 | James | H04M 1/0202 379/446 |
| 6,320,962 | B1 * | 11/2001 | Eisenbraun | B60R 11/0241 379/446 |
| 6,324,285 | B1 * | 11/2001 | Dowsett | B60R 11/0241 242/400 |
| 6,999,008 | B2 * | 2/2006 | Wang | G06F 1/1632 341/22 |
| 8,965,302 | B2 * | 2/2015 | Tamatsu | H04M 1/06 455/550.1 |
| 9,471,103 | B2 * | 10/2016 | Shibuya | G06F 1/163 |
| 9,527,590 | B2 * | 12/2016 | Matsumoto | F16M 1/00 |
| 9,853,673 | B2 * | 12/2017 | Usuginu | H04B 1/3833 |
| 9,975,638 | B2 * | 5/2018 | Usuginu | B64D 11/00155 |
| 2003/0068986 | A1 * | 4/2003 | Oh | B60R 11/0241 455/90.1 |
| 2014/0016799 | A1 * | 1/2014 | Kumar | H04R 1/04 381/122 |
| 2015/0103484 | A1 | 4/2015 | Shibuya et al. | |
| 2016/0286676 | A1 * | 9/2016 | Usuginu | B64D 11/00155 |

FOREIGN PATENT DOCUMENTS

| | | |
|---|---|---|
| JP | 2010-147605 | 7/2010 |
| JP | 2012-147344 | 8/2012 |
| JP | 2014-73038 | 4/2014 |
| JP | 2015-76826 | 4/2015 |
| JP | 2015-211388 | 11/2015 |

* cited by examiner

APPARATUS WITH A CRADLE FOR AN ELECTRONIC DEVICE

CROSS-REFERENCE TO RELATED APPLICATION

This application claims benefit to U.S. provisional application No. 62/640,024 filed on Mar. 8, 2018. The entire disclosure of U.S. provisional application No. 62/640,024 is hereby incorporated herein by reference.

BACKGROUND

Technical Field

The present disclosure relates to an apparatus that includes a cradle for storing and detachably holding an electronic terminal.

Background Art

Japanese Patent No. 3296207 discloses an apparatus that causes an electronic terminal to rotate when removing the electronic terminal from a cradle. The cradle includes a thick portion and a thin portion caused by a step that is disposed in either a front section or a back section. The electronic terminal can be removed from the cradle by causing a plurality of grooves disposed in both side surfaces of the electronic terminal to engage with a plurality of protrusions disposed on an inner wall of the cradle, causing the electronic terminal to pivot with the protrusions as a rotational axis, and using the step to press the electronic terminal down.

BRIEF SUMMARY

The present disclosure provides an apparatus that includes a cradle that is effective for stably holding and detaching an electronic device.

The apparatus of the present disclosure includes an electronic terminal and a cradle that removably holds the electronic terminal. The cradle includes a main body portion that has a longitudinal direction, a storage section, a cord insertion portion, and a push-up member. The storage section is disposed in the main body, and includes a recess formed from a bottom surface, two side surfaces extending along the longitudinal direction, and two end surfaces extending along a lateral direction that crosses the longitudinal direction. The storage section can accommodate an entire length of the electronic terminal. The cord insertion portion is open at a first end surface of the two end surfaces. A cord of the electronic terminal is passed through the cord insertion portion. The push-up member retractably projects from the bottom surface of the storage section, and abuts against the electronic terminal stored in the storage section. The electronic terminal is configured to be stored in the storage section so as to form a space between the electronic terminal and the bottom surface of the storage section. The electronic terminal can pivot to a side of the first end surface of the storage section due to the push-up member projecting.

DETAILED DESCRIPTION

Next, embodiments will be described in detail while appropriately referencing the drawings. Note that, in some cases, unnecessarily detailed descriptions are foregone. For example, detailed descriptions of well-known matters and redundant descriptions of configurations and constituents that are substantially the same may be foregone. This is to avoid unnecessary redundancy in the following description and to facilitate understanding by persons skilled in the art.

Note that the following description and attached drawings are provided for the purpose of enabling a person skilled in the art to comprehend the present disclosure, and are not intended by the applicant to limit the subject matters recited in the claims.

In the following description, the "up" direction is the direction of removing the electronic terminal from the cradle and, in some cases, the direction opposite the "up" direction is referred to as the "down" direction. As such, the "down" direction is not limited to the direction of gravity.

1. Embodiment 1

A pop-up type cradle according to Embodiment 1 will be described using FIGS. 1 to 9.

1-1 Configuration

Figure 1:
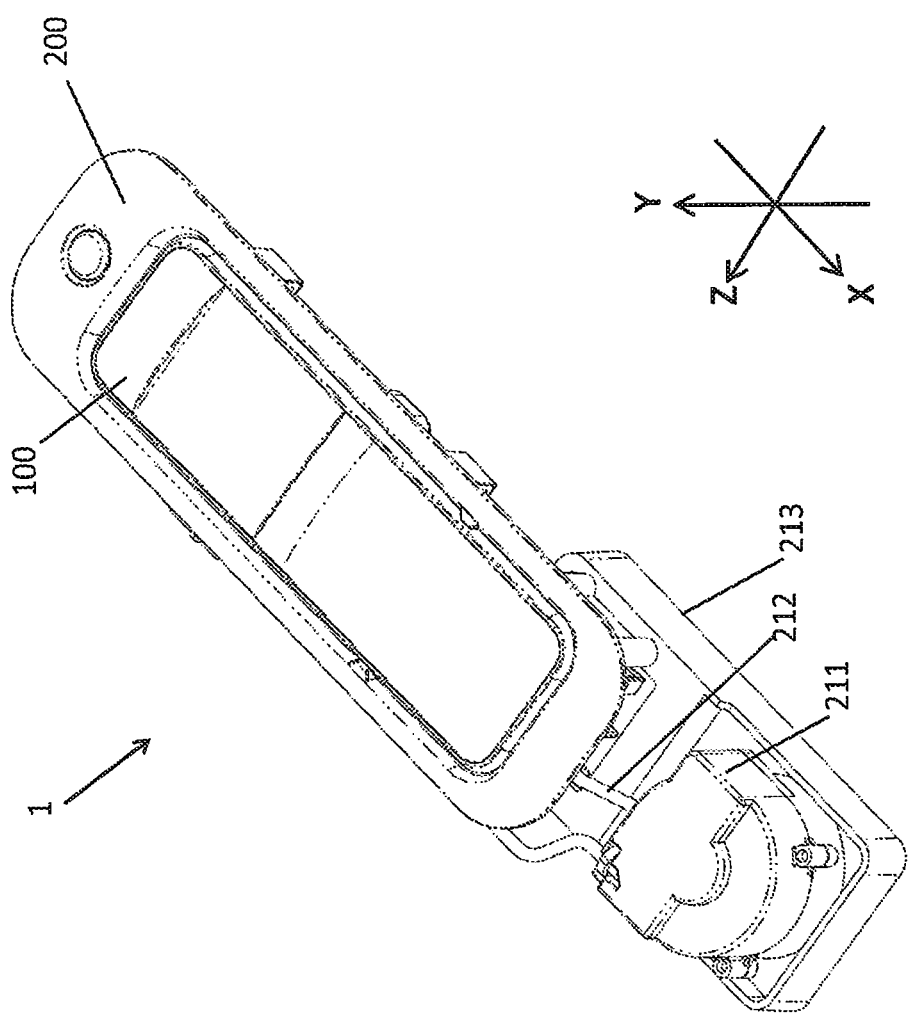
FIG. 1 is a perspective view of a system according to Embodiment 1 in which a handset is stored in a cradle.

FIG. 1 is a perspective view illustrating the appearance of an apparatus 1 according to Embodiment 1. The apparatus 1 includes a handset 100 and a cradle 200 that stores the handset 100. As described later, the apparatus 1 may also include a cord reel 211, and a cord reel holder 213 that holds the cord reel 211.

The cradle 200 is capable of accommodating the handset 100. In one example, the cradle 200 is installed in a seat of an aircraft or the like. A passenger or the like (hereinafter referred to as "user") of the aircraft can receive various services in the aircraft by removing the handset 100 from the cradle 200 and operating the handset 100. Note that, for the sake of description, the longitudinal direction of the cradle 200 is defined as the X-axis direction in each of the drawings. The positive direction in the X-axis direction is referred to as the "X-axis positive direction", and the negative direction in the X-axis direction is referred to as the "X-axis negative direction," The direction in which the handset 100 attaches to and detaches from the cradle 200 is defined as the Y-axis direction. The direction in which the handset 100 is removed from the cradle 200 is referred to as the Y-axis positive direction, and the opposite direction is referred to as the Y-axis negative direction. The direction orthogonal to the X-axis and the Y-axis is defined as the Z-axis direction. In some cases, the Y-axis positive side is referred to as "up" and the Y-axis negative side is referred to as "down."

Figure 2:
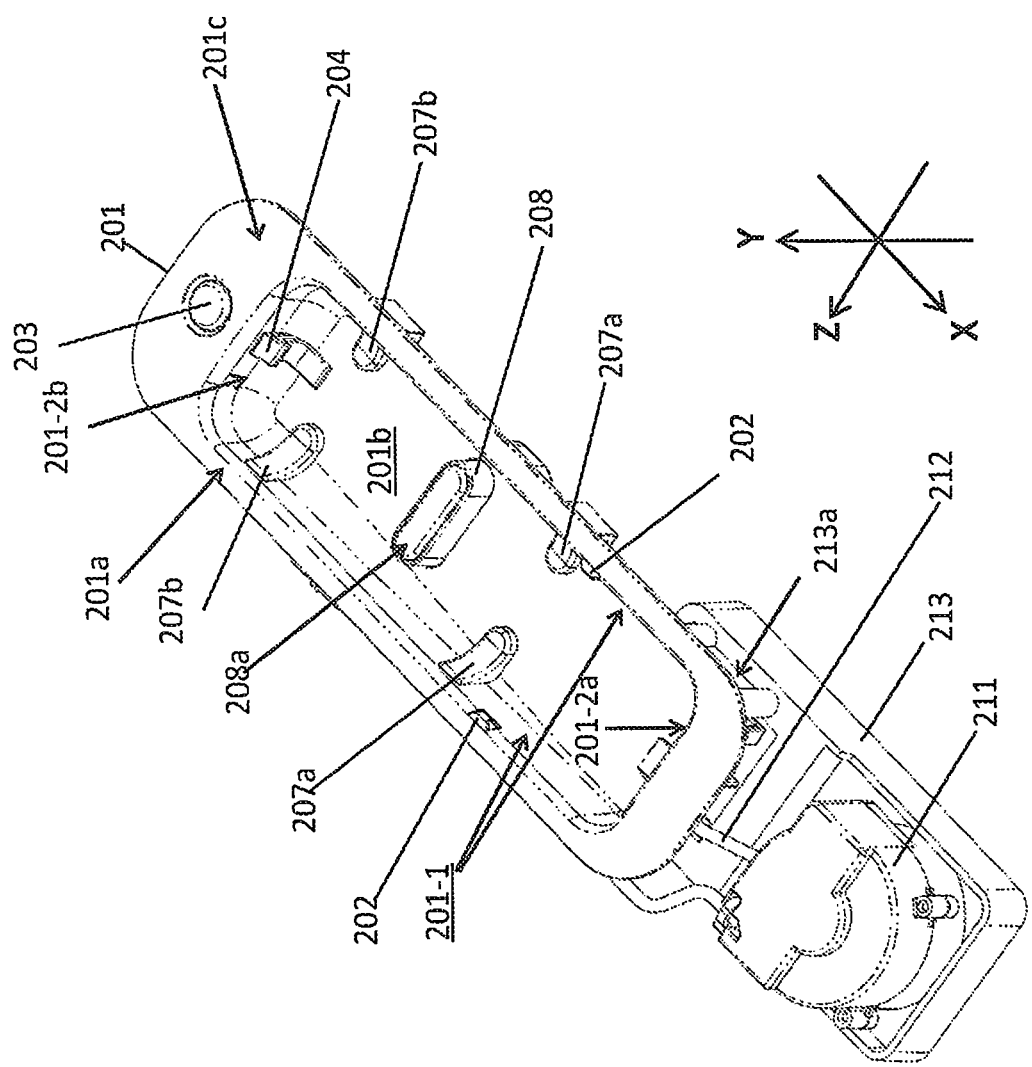
FIG. 2 is a perspective view of the cradle according to Embodiment 1.
Figure 3:
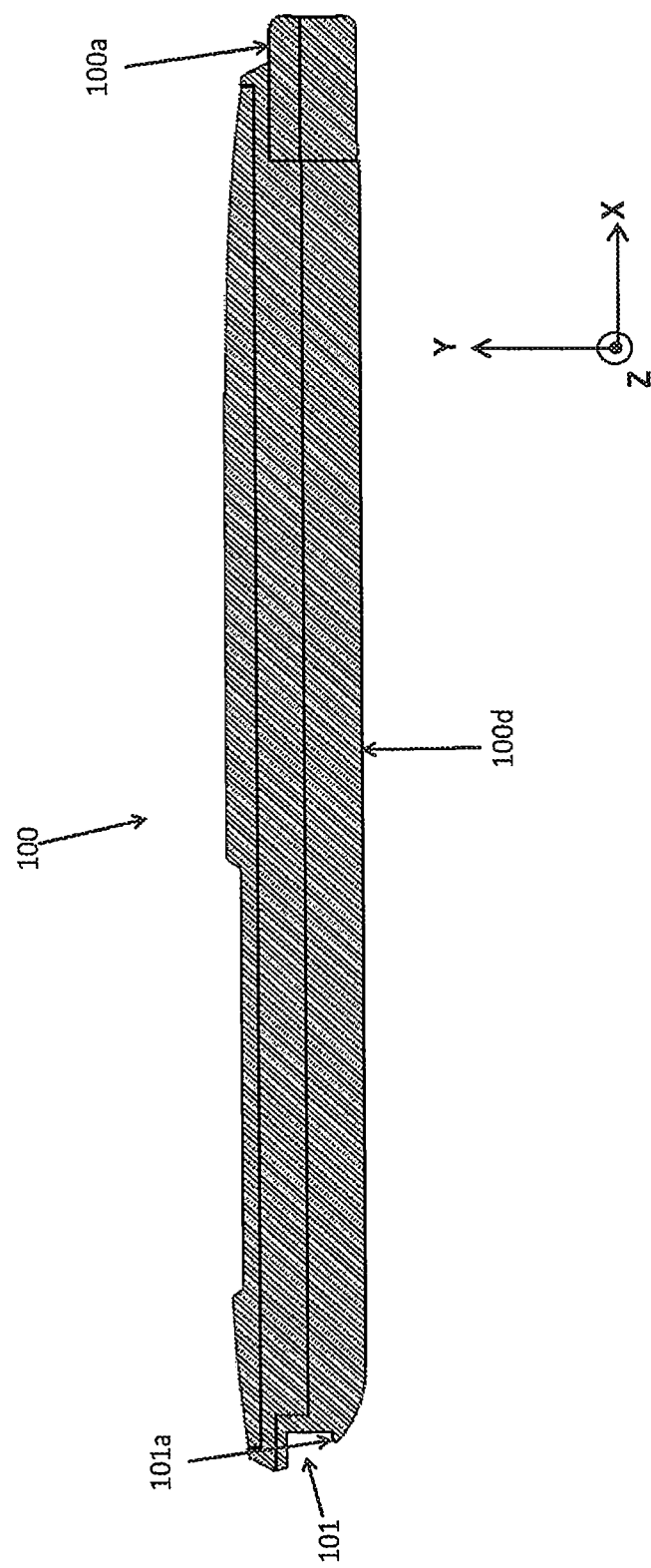
FIG. 3 is a longitudinal direction cross-sectional view of the handset according to Embodiment 1.
Figure 4:
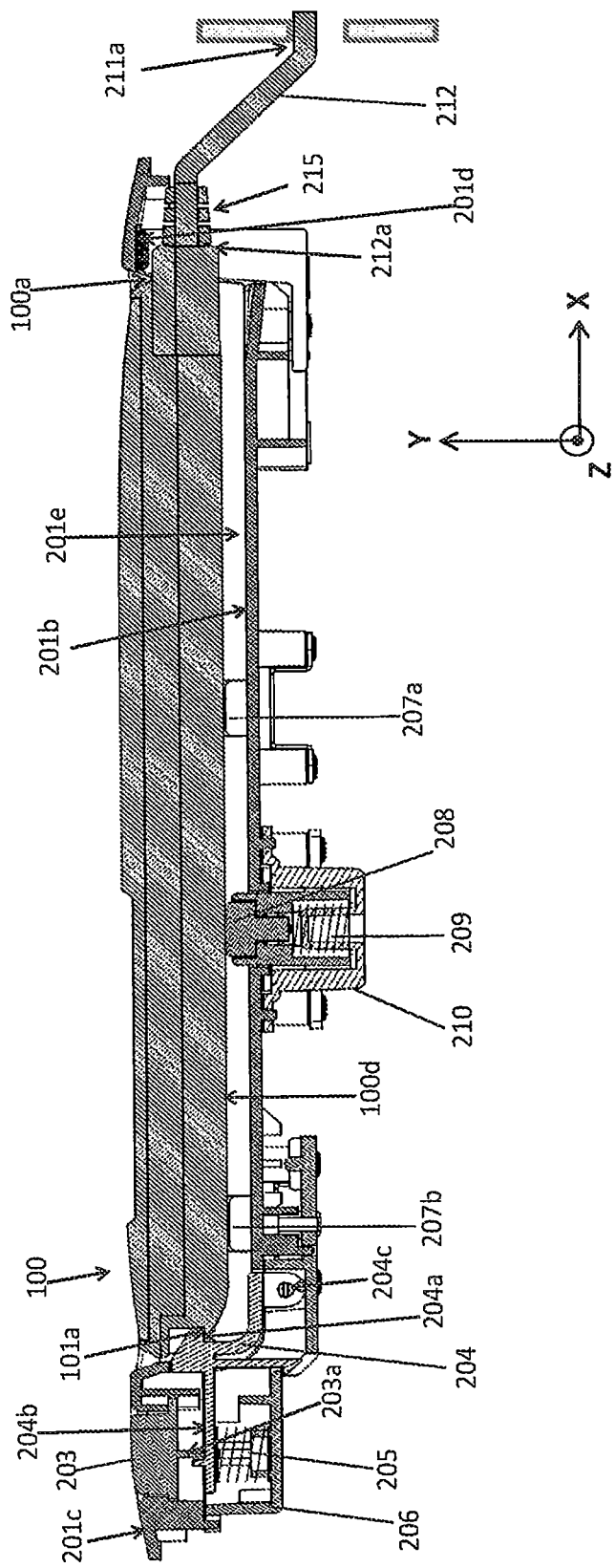
FIG. 4 is a longitudinal direction cross-sectional view of the system according to Embodiment 1 in which the handset is stored in the cradle.
Figure 6:
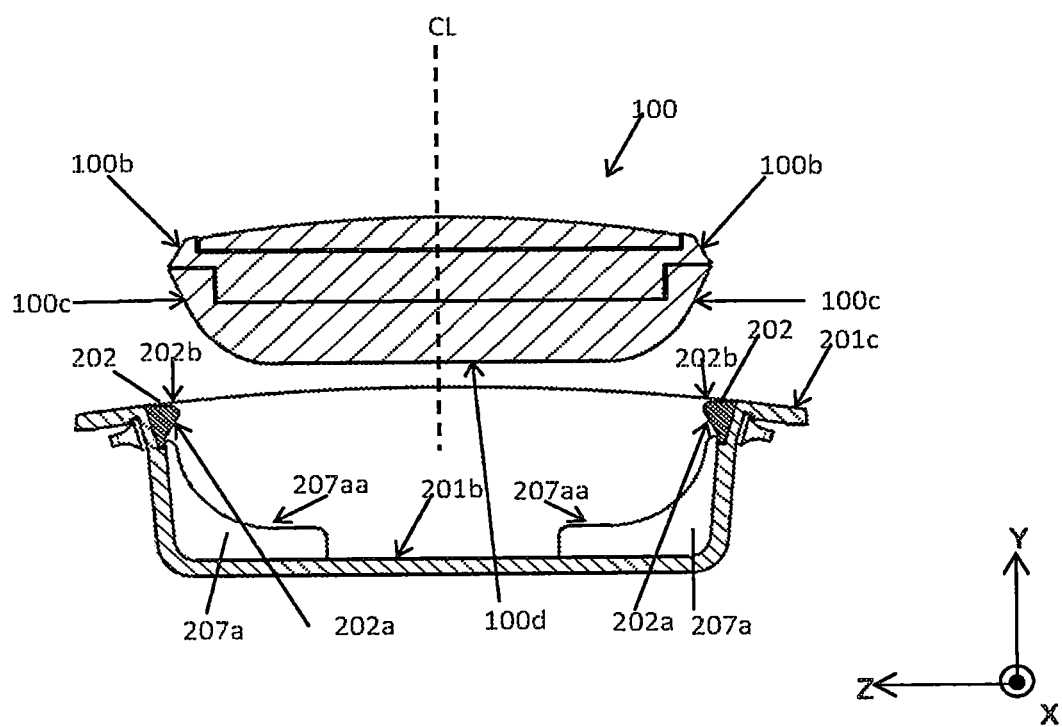
FIG. 6 is a lateral direction cross-sectional view of an apparatus according to Embodiment 1, prior to the handset being stored.
Figure 8:
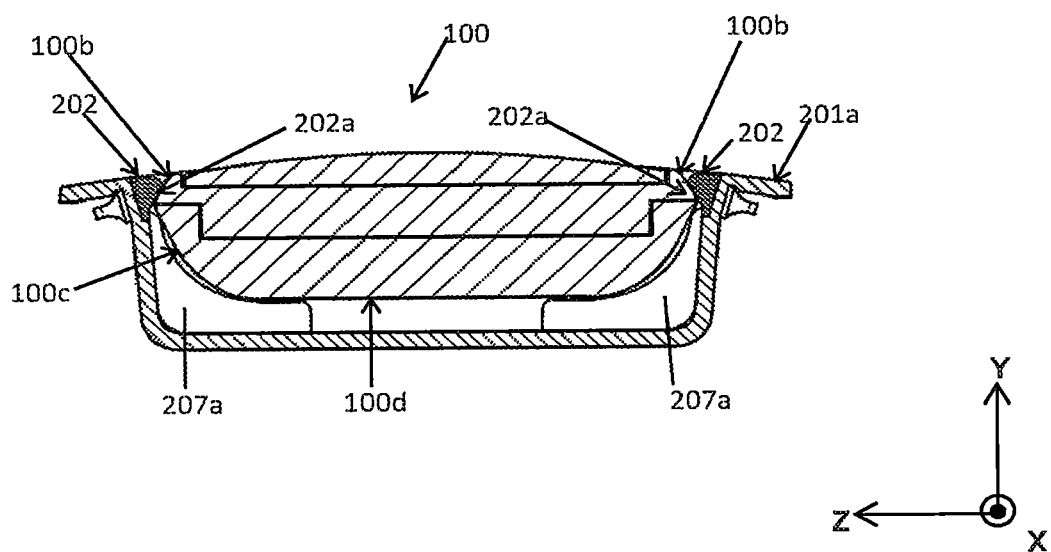
FIG. 8 is a lateral direction cross-sectional view of the apparatus according to Embodiment 1, in which the handset is stored.

FIG. 2 is a perspective view of the cradle 200. FIG. 3 is a cross-sectional view of the handset 100, taken along the XY plane, FIG. 4 is a cross-sectional view taken along the XY plane, and illustrates a state in which the handset 100 is stored in the cradle 200. FIG. 6 is a cross-sectional view taken along the YZ plane, and illustrates a state prior to the handset 100 being stored in the cradle 200. FIG. 8 is a cross-sectional view taken along the YZ plane, and illustrates a state after the handset 100 is stored in the cradle 200.

1-1-1 Configuration of Handset

The handset 100 (example of the electronic terminal) includes an elongated main body along the X-axis and, as illustrated in FIGS. 3 and 6, includes a recess 101, a surface 100a, a surface 100b, a surface 100c, and a surface 100d. The surface 101a is formed on the lower portion of the recess 101.

The recess 101 is located on a first end surface that extends along the lateral direction of the handset 100, on the X-axis negative side of the handset 100. The recess 101 is concave in the X-axis positive direction. The surface 101a is located in the recess 101, facing the Y-axis positive direction.

The surface 100a is located on a second end surface that extends along the lateral direction of the handset 100, on the X-axis positive side of the handset 100. The surface 100a is directed toward the Y-axis positive direction.

As illustrated in FIG. 6, the surface 100b (example of the first inclined surface) is located on the upper sides of the two side surfaces that extend along the longitudinal direction of the handset 100, and are inclined with respect to a center line CL of the handset 100. From the perspective of FIG. 6, the surface 100b is located facing diagonally upward.

As illustrated in FIG. 6, the surface 100c (example of the second inclined surface) is located on the lower sides of the two side surfaces that extend along the longitudinal direction of the handset 100, and are inclined with respect to the center line CL of the handset 100. From the perspective of FIG. 6, the surface 100c is directed diagonally downward.

The surface 100d is the bottom surface of the handset 100.

The handset 100 includes a connection portion 212a on the end surface on the surface 100a side. The connection portion is where a cord 212 (FIG. 4 and FIG. 5) is connected.

1-1-2 Configuration of Cradle

Figure 5:
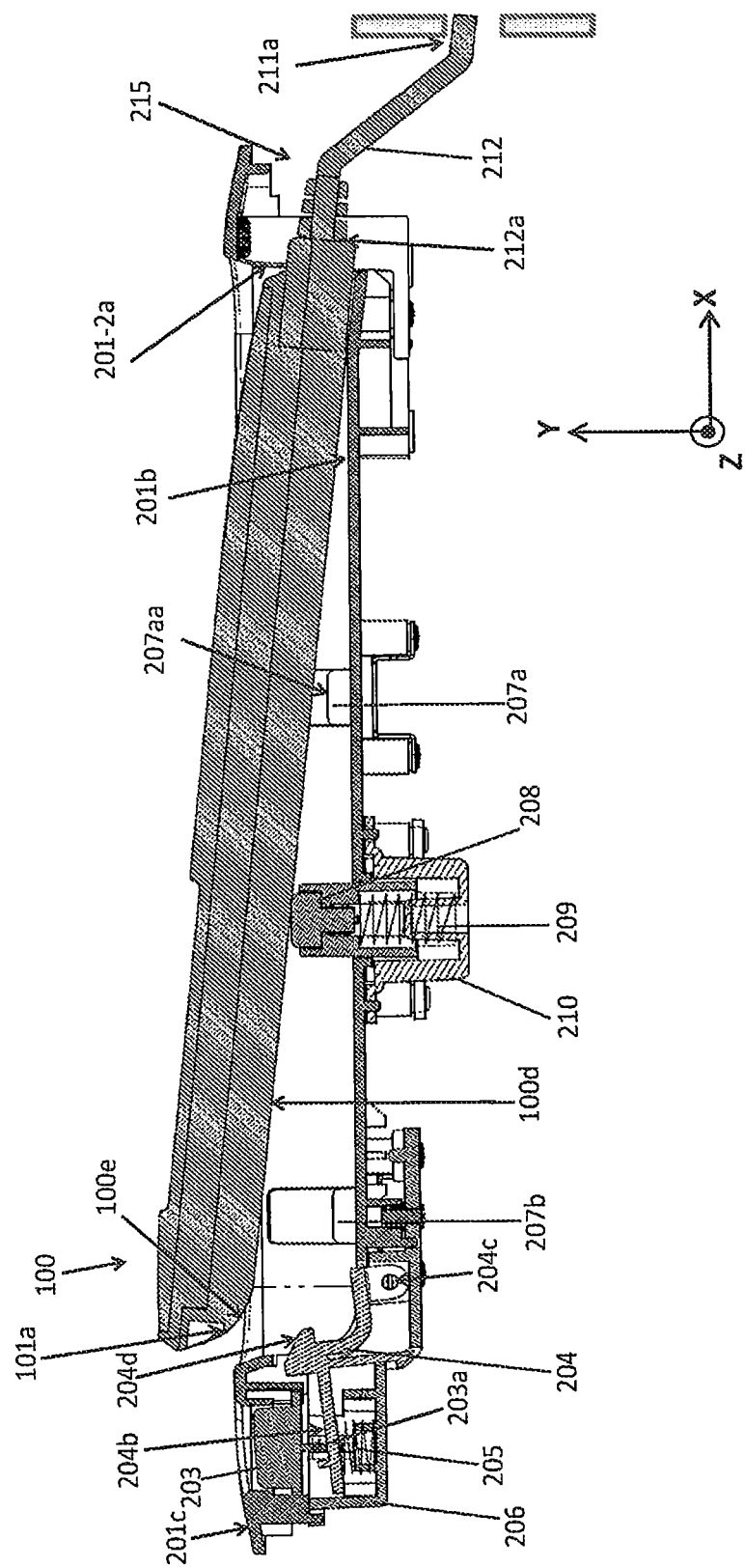
FIG. 5 is a longitudinal direction cross-sectional view of the system according to Embodiment 1 in which the handset is popped up from the cradle.

The cradle 200 includes a main body 201 and, as illustrated in FIGS. 2, 4, and 5, a storage section 201a, a cord insertion portion 215, and a push-up member 208.

The main body 201 forms the storage section 201a that includes a recess that is concave in the Y-axis negative direction. Specifically, the storage section 201a includes a recess that is formed from a bottom surface 201b, two side surfaces 201-1 and 201-1 that extend along the X-axis, and two end surfaces 201-2a and 201-2b that extend along the Z-axis. The storage section 201a is capable of accommodating the entire length of the handset 100. Furthermore, the main body 201 includes a surface 201c (FIG. 2) formed extending along the ZX plane from an opening outer edge of the storage section 201a, and a surface 201d (FIG. 4) that abuts against the surface 100a when the handset 100 is stored and suppresses movement of the handset 100 in the Y-axis positive direction.

As illustrated in FIGS. 4 and 5, the cord insertion portion 215 is open on the first end surface 201-2a on the X-axis positive side of the two end surfaces of the main body 201 of the cradle 200. The cord 212 of the handset 100 passes through the cord insertion portion 215.

As illustrated in FIGS. 4 and 5, the push-up member 208 retractably projects from the bottom surface 201b of the storage section 201a, and is disposed more to the X-axis negative side (that is, closer to the second end surface 201-2b (FIG. 2)) than the center of the storage section 201a in the longitudinal direction (the X-axis direction). The push-up member 208 includes a spring 209 and a spring holder 210 that holds the spring 209. The spring 209 (example of the elastic member) exhibits urging force upwards, that is, toward the bottom of the handset 100 stored in the storage section 201a. The spring holder 210 is disposed below the bottom of the cradle 200 and holds the spring 209. As illustrated in FIG. 2, the push-up member 208 further includes a surface 208a. The surface 208a abuts against the bottom of the handset 100 that is stored in the storage section 201a, The push-up member 208 protrudes from the bottom surface 201b of the storage section 201a and is capable of advancing and retracting in accordance with the urging of the spring 209.

The push-up member 208 is capable of moving between a fifth position and a sixth position. The fifth position is, as illustrated in FIG. 4, a state in which the handset 100 is stored in the storage section 201a and the push-up member 208 is retracted from the sixth position. The sixth position is, as illustrated in FIG. 5, a position more to the Y-axis positive direction than the fifth position, that is, a position positioned in the direction in which the handset 100 detaches from the cradle 200.

When the handset 100 is stored in the cradle 200, as illustrated in FIG. 4, the push-up member 208 is pushed down in the Y-axis negative direction and held at the fifth position. When the handset 100 is detached from the cradle 200, the push-up member 208 reaches the sixth position (FIG. 5) due to the urging force of the spring 209.

The handset 100 is stored in the storage section 201a so as to form a space 201e between the handset 100 and the bottom surface 201b of the storage section 201a and, as illustrated in FIG. 5, can pivot to the first end surface 201-2a side of the storage section 201a due to the projecting of the push-up member 208.

The cradle 200 may further include an anchor member 202, a handset support 207a, an unlock button 203, a locking claw 204, a spring 205, and a spring holder 206.

As illustrated in FIG. 2, the anchor member 202 is disposed on the top edges or slightly below the top edges of the two side surfaces 201-1 of the storage section 201a. Specifically, the anchor member 202 is disposed at positions close to the surface 201c on both sides of the storage section 201a. The anchor member 202 protrudes from each of the two side surfaces 201-1 inward into the storage section 201a. The anchor member 202 is made from an elastic material such as rubber. The degree of the anchor member 202 that protrudes can be adjusted. The anchor member 202 is disposed, in the longitudinal direction (the X-axis direction), between the push-up member 208 and the cord insertion portion 215. As illustrated in FIG. 6, the anchor member 202 includes a surface 202a and a surface 202b. The surface 202a (example of the third inclined surface) is inclined toward the bottom surface 201b of the storage section 201a.

That is, from the perspective of FIG. 6, the surface 202a is directed diagonally downward. The surface 202b has an arc-like shape and is located on the Y-axis positive direction side of the surface 202a. As illustrated in FIG. 8, the surface 202a of the anchor member 202 is provided at a position that can abut against the surface 100b of the handset 100 that is stored in the storage section 201a. The surface 202a of the anchor member 202 is also provided at a position that can abut against the surface 100b of the handset 100 in a state in which the handset 100 is popped up and pivoted as illustrated in FIG. 5, The anchor member 202 prevents the handset 100 from excessively jumping out and falling when the handset 100 is removed from the storage section 201a.

The handset support 207a (example of the first support member) is disposed, in the longitudinal direction (the X-axis direction) of the storage section 201a, between the push-up member 208 and the cord insertion portion 215. As illustrated in FIG. 6, the handset support 207a includes a surface 207aa. The handset support 207a protrudes into the storage section 201a from the left and right sides of the bottom surface 201b. The surface 207aa, abuts against the bottom surface of the handset 100 when the handset 100 is stored in the storage section 201a. As a result of this configuration, the handset support 207a supports the handset 100 at a position above (on the Y-axis positive side) the bottom surface 201b of the storage section 201a. Due to the handset support 207a, a space is formed in the cradle 200 in which the handset 100 is stored, between the bottom surface 100d of the handset 100 and the bottom surface 201b of the storage section 201a. Of this space, the space on the X-axis positive side of the anchor member 202 (described later) is defined as a space 201e (FIG. 4).

As illustrated in FIG. 2, another handset support 207b may be used. The handset support 207b (example of the second support member) is disposed, in the longitudinal direction of the storage section 201a, between the push-up member 208 and the second end surface 201-2b (FIG. 2) on the X-axis negative side of the storage section 201a. The handset support 207b has the same configuration as the handset support 207a. Specifically, the handset support 207b protrudes from the left and right sides of the bottom surface 201b of the storage section 201a, and holds the handset 100 at a position above the bottom surface 201b when the handset 100 is stored in the storage section 201a.

As illustrated in FIGS. 4 and 5, the unlock button 203 (example of the operation portion) includes a claw 203a. The unlock button 203 is disposed on the X-axis negative side (the side opposite the cord reel 211) of the cradle 200, and is capable of moving in the Y-axis direction between a first position illustrated in FIG. 4 and a second position illustrated in FIG. 5 that is on the Y-axis negative side of the first position.

As illustrated in FIG. 2, the locking claw 204 is disposed in the storage section 201a. The locking claw 204 is connected to the unlock button 203. As illustrated in FIGS. 4 and 5, the locking claw 204 includes a surface 204a, a pressed portion 204b, a shaft 204c, and a surface 204d. The locking claw 204 is pivotable around the shaft 204c. The locking claw 204 can move between a third position illustrated in FIG. 4 and a fourth position illustrated in FIG. 5 by pivoting around the shaft 204c. At the third position, the locking claw 204 engages with the surface 101a of the handset 100. At the fourth position, the locking claw 204 disengages from the surface 101a of the handset 100.

As illustrated in FIGS. 4 and 5, the Y-axis positive side of the pressed portion 204b of the locking claw 204 abuts against the claw 203a of the unlock button 203. In addition, the Y-axis negative side of the pressed portion 204b of the locking claw 204 connects to the spring 205 that is held by the spring holder 206. The spring 205 urges the pressed portion 204b upward, that is, in the Y-axis positive direction. As illustrated in FIG. 4, when the locking claw 204 is at the third position, the unlock button 203 is pressed up in the Y-axis positive direction and is positioned at the first position. The unlock button 203 moves in the Y-axis negative direction as a result of being pressed by a user. When the unlock button 203 reaches the second position (FIG. 5), as a result of this movement, the pressed portion 204b of the locking claw 204 is pressed by the claw 203a in the Y-axis negative direction against the urging force of the spring 205 and, as a result, the locking claw 204 pivots and moves to the fourth position (FIG. 5).

As illustrated in FIGS. 1 and 2, the apparatus 1 may also include a cord reel 211, and a cord reel holder 213.

As illustrated in FIGS. 4 and 5, the cord reel 211 includes an opening 211a. The cord 212 of the handset 100 is stored on the cord reel 211 and can be extended out and retracted back through the opening 212a. The cord 212 that has been extended out from the cord reel 211 is connected to the handset 100 at the connection portion 212a.

The cord reel holder 213 has a configuration that fixes and holds the cord reel 211. As illustrated in FIG. 2, the cord reel holder 213 is connected and fixed, by a connection portion 213a, to the lower portion of the cradle 200 on the first end surface 201-2a, that is, on the X-axis positive side of the cradle 200.

The opening 211a is disposed in the X-axis positive direction and the Y-axis negative direction with respect to the connection portion 212a. That is, the opening 211a is disposed below the connection portion 212a. As such, a force pulling the handset 100 in the direction of the opening 211a acts on the cord 212 when the handset 100 is stored in the cradle 200.

When the user uses the handset 100, the cord 212 is extended out from the cord reel 211. However, the cord 212 extended out at that time may become caught on or contact the anchor member 202 and the resulting friction may inhibit the pulling out operation. As such, the inclination of the surface 202a of the anchor member 202 may be reduced, thereby reducing the possibility of the cord 212 becoming caught on the anchor member 202. The anchor member 202 abuts against the surface 100b of the handset 100 when the handset 100 is popped up and pivoted. As such, depending on the orientation in which the cradle 200 is installed (for example, in a transverse direction orthogonal to the direction of gravity, or the like), the anchor member 202 supports the posture of the handset 100 and fulfills a role of preventing the handset 100 from falling from the cradle 200. Therefore, the anchor member 202 may be positioned in the X-axis direction, more in the X-axis negative direction than the center of gravity position of the handset 100. Alternatively, since the tension of the cord 212 is acting on the handset 100, the anchor member 202 may be positioned more in the X-axis positive direction than the center of gravity position of the handset 100. As described above, the anchor member 202 has a certain amount of protrusion from the main body 201 in order to fulfill the role of supporting the posture of the handset 100 while the handset 100 is popped up. This certain amount of protrusion prevents the handset 100 that is pushed up by the push-up member 208 from easily overcoming the anchor member 202. However, due to the tension of the cord 212 on the handset 100 acting in the same rotational direction as the pushing of the push-up member 208, it is possible to mitigate the momentum at which the handset 100 flies out from the cradle 200. As a result, it is possible to reduce the amount of protrusion of the anchor member 202, which is useful for maintaining design.

1-2 Operations 1-2-1 Operations when Removing Handset

Next, the operations performed when removing the handset 100 from the cradle 200 will be described using FIGS. 4, 5, 8, and 9.

In FIG. 4, the locking claw 204 is positioned at the third position due to the urging of the spring 205, and the surface 204a is engaged with the surface 101a of one end of the handset 100. The unlock button 203 is positioned at the first position by the pressed portion 204b of the locking claw 204. The push-up member 208 is held at the fifth position by the pressing of the handset 100. The surface 100a of the second end of the handset 100 abuts against the surface 201d of the cradle 200. As a result, the handset 100 is stored and held in the storage section 201a of the cradle 200. The bottom surface 100d of the handset 100 abuts against the handset supports 207a and 207b. As a result, the space 201e is formed between the bottom surface 201h of the storage section 201a and the bottom surface 100d of the handset 100. The position where the handset 100 is stored in the cradle 200 is defined as a seventh position (FIG. 4), and the position where the handset 100 is popped up from the cradle 200 is defined as an eighth position (FIG. 5). As illustrated in FIG. 8, the surface 100b of the handset 100 abuts against the surface 202a of the anchor member 202.

When a user presses the unlock button 203, the unlock button 203 moves from the first position (FIG. 4) to the second position (FIG. 5). Accordingly, the claw 203a moves in the Y-axis negative direction and, linked to that movement, the pressed portion 204b abutted against the claw 203a moves in the Y-axis negative direction. As a result, the locking claw 204 moves from the third position (FIG. 4) to the fourth position (FIG. 5). As a result, the engagement between the surface 101a of the handset 100 and the surface 204a of the locking claw 204 is released, and the holding of the handset 100 by the locking claw 204 is released. Then, due to the urging of the spring 209, the push-up member 208 moves from the fifth position (FIG. 4) to the sixth position (FIG. 5), thereby pushing the handset 100 up.

The bottom surface 100d of the handset 100 is pressed on by the surface 208a of the push-up member 208 due to the push-up member 208 moving from the fifth position (FIG. 4) to the sixth position (FIG. 5). As a result, the handset 100 is pressed up. Specifically, the portion of the handset 100 more in the X-axis negative direction than the anchor member 202 is pressed up from the seventh position (FIG. 4) to the eighth position (FIG. 5) that is positioned more to the Y-axis positive side than the seventh position. Meanwhile, the portion of the handset 100 more to the X-axis positive side than the anchor member 202 is pulled down from the seventh position (FIG. 4) to the eighth position (FIG. 5) that is positioned more to the Y-axis negative side than the seventh position. Since the space 201e is provided and there is tension on the connection portion 212a between the handset 100 and the cord 212, the handset 100 can be pivoted around the anchor member 202 in accordance with the projecting of the push-up member 208.

Figure 9:
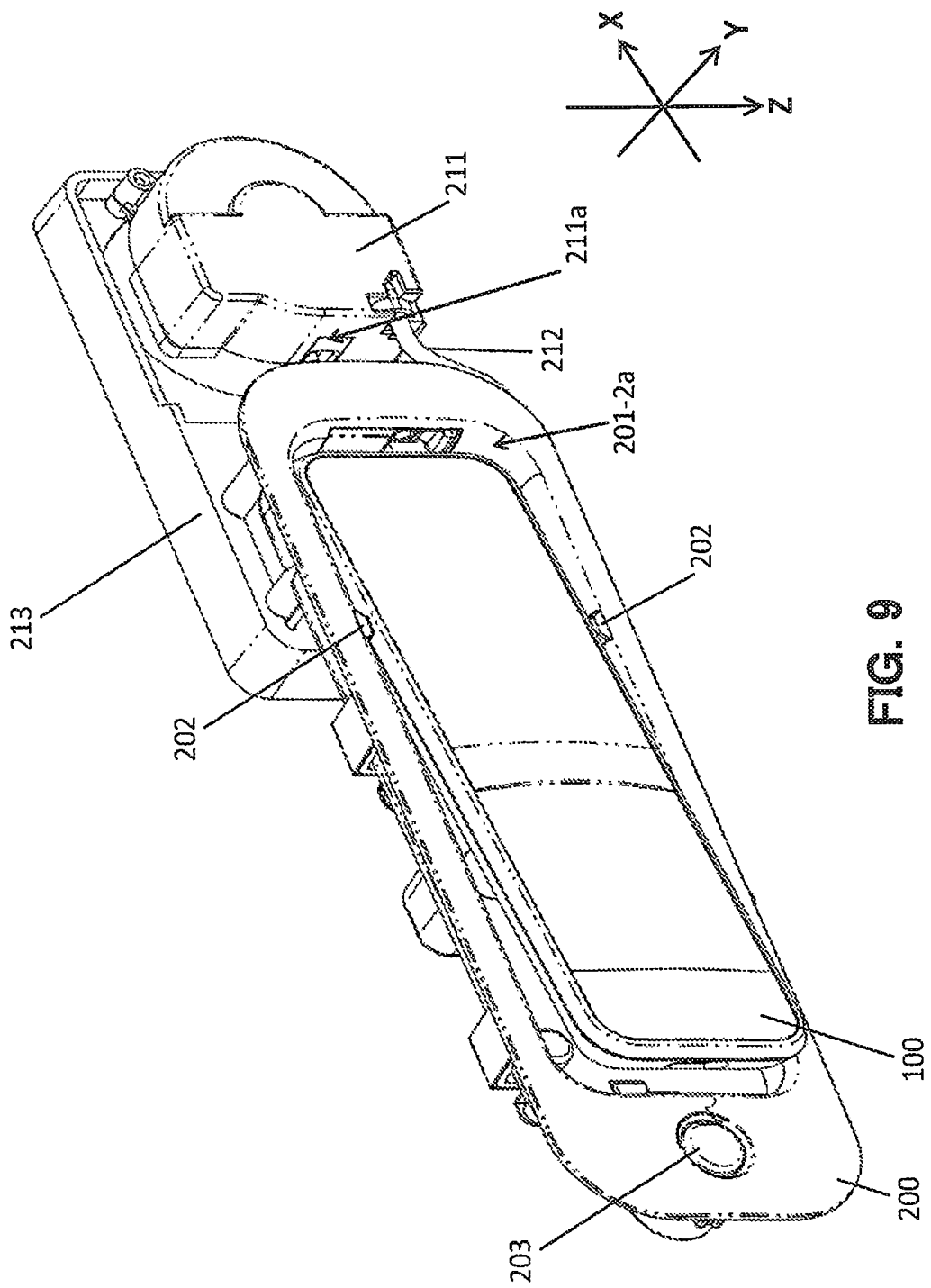
FIG. 9 is a perspective view of the apparatus according to Embodiment 1, in which the handset is popped up.

The attachment orientation of the cradle 200 is not limited and the cradle 200 may be installed in seat backs or armrests of aircraft, and the like. For example, as illustrated in FIG. 9, the cradle 200 may be attached in an orientation orthogonal to the direction of gravity (the Z-axis positive direction). When removing the handset 100, the unlock button 203 moves from the first position (FIG. 4) to the second position (FIG. 5), the locking claw 204 moves from the third position (FIG. 4) to the fourth position (FIG. 5), and the push-up member 208 moves from the fifth position (FIG. 4) to the sixth position (FIG. 5). At this time, the handset 100 moves from the seventh position (FIG. 4) to the eighth position (FIG. 5) and assumes the state illustrated in FIG. 9 due to the tension of the cord on the connection portion 212a and the pushing up by the push-up member 208. At this time the anchor member 202 prevents the handset 100 from falling from the cradle 200. Additionally, the portion of the handset 100 more in the X-axis positive direction than the anchor member 202 moves in the Y-axis negative direction due to the tension of the cord 212, and abuts against the bottom surface 201b of the storage section 201a (FIG. 5), thereby making it possible to maintain the popped up posture and the amount of protrusion of the handset 100.

In the states illustrated in FIGS. 5 and 9, the user can remove the handset 100 by gripping the portion of the handset 100 that is protruding from the cradle 200. When the handset 100 is removed and moved in the Y-axis positive direction from the eighth position, the anchor member 202 elastically deforms. As a result, the handset 100 can overcome the anchor member 202.

1-2-2 Operations when Storing Handset

Next, the operations carried out when storing the handset 100 in the cradle 200 will be described using FIGS. 4, 5, 6, 7, and 9.

In FIG. 6, the handset 100 gripped by the user is moved in the Y-axis negative direction into the storage section 201a.

Figure 7:
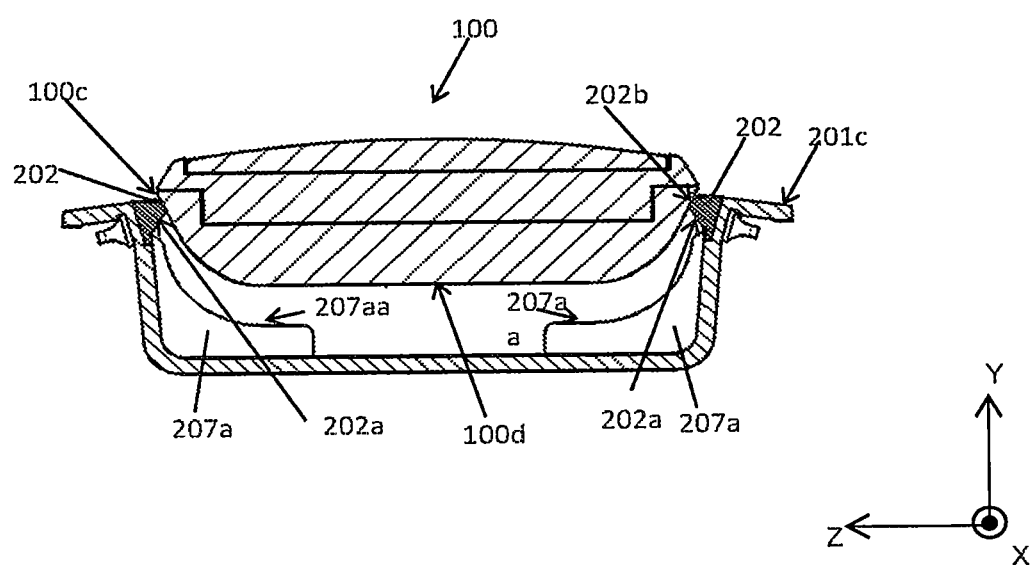
FIG. 7 is a lateral direction cross-sectional view of the apparatus according to Embodiment 1, immediately before the handset is stored.

FIG. 7 is a cross-sectional view taken along the YZ plane, and illustrates a state immediately prior to the handset 100 being stored in the cradle 200. In FIG. 7, the surface 100c of the handset 100 abuts against the anchor member 202. When the handset 100 is moved in the Y-axis negative direction from this state, the anchor member 202 is pressed on by the surface 100c and elastically deforms. As a result, the handset 100 overcomes the surface 202b of the anchor member 202 and reaches the eighth position (FIGS. 5 and 8).

In FIG. 5, the handset 100 is positioned at the eighth position, and moves in the Y-axis negative direction toward the seventh position, which is the stored position. At this time, the surface 208a of the push-up member 208 is pressed against the urging force of the spring 209 by the bottom surface 100d of the handset 100, and the push-up member 208 moves from the sixth position (FIG. 5) to the fifth position (FIG. 4). The surface 204d of the locking claw 204 abuts against the surface 100e of the handset 100 and the locking claw 204 is pressed in the Y-axis negative direction, thereby pivoting the locking claw 204 from the fourth position (FIG. 5) to the third position (FIG. 4). Along with the movement of the handset 100 to the seventh position (FIG. 4), the locking claw 204 pivots from the third position (FIG. 5) to the fourth position (FIG. 4), and the surface 204a engages with the surface 101a of the handset 100. As a result, the handset 100 assumes a state of being stored and held in the cradle 200, as illustrated in FIG. 4.

In FIG. 8, the handset 100 is positioned at the seventh position, the same as in FIG. 4. At this time, the surface 202a of the anchor member 202 is abutted against the surface 100b of the handset 100.

1-3 Features

The apparatus 1 according to the present disclosure includes the handset 100 and the cradle 200 that removably holds the handset 100. The cradle 200 includes the main body 201 that has the longitudinal direction, the storage section 201a, the cord insertion portion 215, and the push-up member 208. The storage section 201a is disposed in the main body 201, includes the recess formed from the bottom surface 201b, the two side surfaces 201-1 and 201-1 extending along the longitudinal direction, and the two end surfaces 201-2a, 201-2b extending along the lateral direction that crosses the longitudinal direction, and can accommodate the entire length of the handset 100. The cord insertion portion 215 is open on the first end surface 201-2a of the two end surfaces 201-2a and 201-2b, and the cord 212 of the handset 100 is passed through the cord insertion portion 215. The push-up member 208 retractably projects from the bottom surface 201b of the storage section 201a and abuts against the handset 100 stored in the storage section 201a The handset 100 is stored in the storage section 201a so as to form the space 201e between the handset 100 and the bottom surface 201h of the storage section 201a, and can pivot to the first end surface 201-2a side due to the projecting of the push-up member 208.

Conventionally, with pop-up type cradles, it is difficult to adjust the amount of protrusion of the electronic terminal from the cradle when removing the electronic terminal from the cradle that stores an electronic terminal such as a handset. For example, the effects of gravity change depending on the attachment orientation of the cradle (the protruding direction of the electronic terminal), and there is a possibility of the electronic terminal falling from the cradle if the electronic terminal protrudes excessively from the cradle. Moreover, when the amount of protrusion of the electronic terminal from the cradle is insufficient, there is a problem in that it is difficult for the user to remove the electronic terminal.

With the apparatus 1 according to the present disclosure, the space 201e is formed, by the handset support 207a, between the bottom surface 100d of the handset 100 and the bottom surface 201b of the storage section 201a. The handset 100 is pushed out upward by the push-up member 208 when removing the handset 100 from the cradle 200. However, due to the space 201e and the tension of the cord 212, the first end surface 201-2a side of the cradle 200 inclines downward, and the handset 100 can be prevented from excessively flying out of the cradle 200. As a result, when removing the handset 100, the risk of the handset 100 falling can be reduced. Moreover, due to the configurations of the apparatus 1 according to the present disclosure, the electronic terminal can be removed from and inserted into the cradle more easily.

Furthermore, the apparatus 1 according to the present disclosure includes the anchor member 202 disposed on the top edges or below the top edges of the two side surfaces 201-1 of the storage section 201a of the cradle 200. The anchor member 202 protrudes from each of the two side surfaces 201-1 inward into the storage section 201a, and holds both sides of the handset 100 stored in the storage section 201a. As a result, the amount of protrusion of the handset 100 from the cradle 200 can be restricted, the handset 100 can be prevented from falling from the cradle 200, and the user can more easily remove the handset 100 from the cradle 200.

Figure 10:
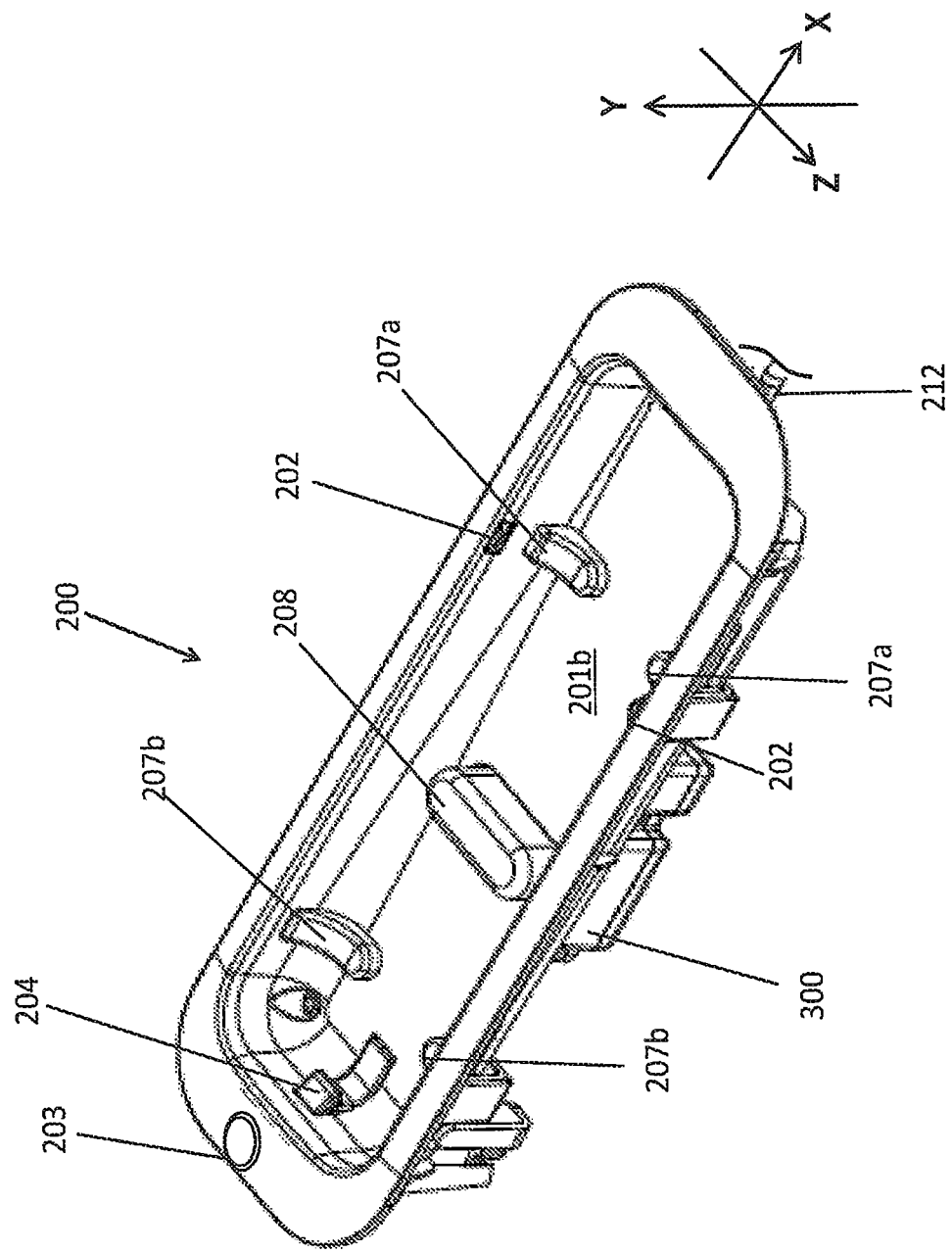
FIG. 10 is a perspective view of a cradle according to another embodiment.

2. Other Embodiments (1) As illustrated in FIG. 10, a configuration is possible in which the cradle 200 includes a counter 300 that is connected to the push-up member 208. The counter 300 counts the number of times the push-up member 208 is pressed. This count is also the number of times the handset 100 is removed from the cradle 200. In other words, this count corresponds to the number of times the cord 212 is extended from the cord reel 211. Thus, the degree of wear of the cord reel 211 can be ascertained by confirming the number of times the push-up member 208 is pressed.

Figure 11:
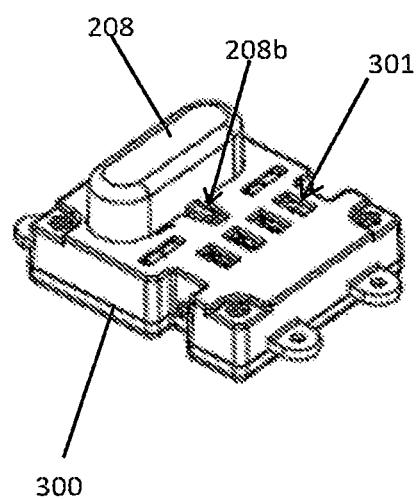
FIG. 11 is a perspective view of a counter to be attached to the cradle illustrated in FIG. 10.

The counter 300 illustrated in FIG. 11 is implemented as a mechanical counter, and includes a count display 301. As illustrated in FIG. 10, the counter 300 is attached to the lower portion of the cradle 200 and is connected to the push-up member 208. With the counter 300, each time the push-up member 208 is pressed, a transfer unit 208b transfers the pressing force to an internal shaft and causes an internal counter to operate via a gear mechanism that is connected to the shaft. The counter display 301 presents information (a number, a symbol, or the like) indicating a number of times that changes each time the internal gear mechanism rotates. Note that the counter 300 may be implemented as an electronic counter, a partially electronic counter, or the like.

The counter 300 counts each time the push-up member 208 is pressed and, as such, the number of times that the user has used the cord reel 211 can be acquired. Conventionally, it is possible to make a record of the date of installation of the cradle 200 using a label or the like, but the wear of the cord reel 211 differs depending on the frequency of use. Meanwhile, attaching a counter to the cord reel 211 itself creates the need to secure installation space and the like. However, the cradle 200 according to the present disclosure includes the push-up member 208. Since the counter 300 is connected to the push-up member 208 using the space that is open in the bottom of the cradle 200, the counter 300 can be disposed without the need for extra space. As a result, the degree of wear of the cord reel 211 can be accurately ascertained, and the maintenance of the apparatus 1 can be effectively carried out.

(2) In the embodiment described above, the cradle 200 can be applied to electronic terminals other than the handset 100.

(3) In the embodiment described above, the handset supports 207a and 207b are implemented as a pair on both sides of the cradle 200, but the arrangement of the handset supports 207a and 207b is not limited thereto. For example, a configuration is possible in which the handset supports 207a and 207h illustrated in FIG. 2 are implemented as a single protrusion that protrudes along the Z-axis direction, that is, the width direction, of the storage section 201a.

In the embodiment described above, the handset supports 207a and 207b are provided separately. However, a configuration is possible in which the handset supports 207a and 207b are implemented as a single protrusion that extends in the X-axis direction of the storage section 201a.

General Interpretation of Terms

In understanding the scope of the present disclosure, the term "configured" as used herein to describe a component, section, or a part of a device includes hardware and/or software that is constructed and/or programmed to carry out the desired function.

In understanding the scope of the present disclosure, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms "including," "having," and their derivatives. Also, the terms "part," "section," "portion," "member," or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a device. The term "circumference" and its derivatives may include a distance or measurement around an outside or an inside of a circle, any other round shape, or any polygonal shape.

Terms that are expressed as "means-plus function" in the claims should include any structure that can be utilized to carry out the function of that part of the present disclosure, Finally, terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected exemplary embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the exemplary embodiments according to the present invention are provided for illustration only, and not for the purpose of limiting the invention as defined by the appended claims and their equivalents.

What is claimed is:

1. An apparatus comprising:
an electronic terminal; and
a cradle configured to removably hold the electronic terminal,
wherein the cradle includes:
a main body having a longitudinal direction;
a storage section in the main body, the storage section including a recess defined by a bottom surface, two side surfaces extending along the longitudinal direction, and two end surfaces extending along a lateral direction that crosses the longitudinal direction, the storage section being capable of accommodating an entire length of the electronic terminal;
a cord insertion portion that is open at a first end surface of the two end surfaces of the storage section, the cord insertion portion being configured to receive a cord of the electronic terminal therethrough;
a push-up member configured to retractably project from the bottom surface of the storage section, and configured to abut against the electronic terminal when the electronic terminal is stored in the storage section; and
an anchor member on or below top edges of the two side surfaces of the storage section, the anchor member protruding inward from the two side surfaces of the storage section into the storage section, the anchor member being configured to hold both sides of the electronic terminal when the electronic terminal is stored in the storage section,
wherein the electronic terminal is configured to be stored in the storage section such that a space is defined between the electronic terminal and the bottom surface of the storage section, the electronic terminal being capable of pivoting to a side of the first end surface of the two end surfaces of the storage section due to the push-up member projecting.

2. The apparatus according to claim 1, wherein
the anchor member is configured to hold the electronic terminal when the electronic terminal is stored in the storage section before and after the push-up member projects and the electronic terminal pivots.

3. The apparatus according to claim 1, wherein
the anchor member is between the push-up member and the cord insertion portion in the longitudinal direction.

4. The apparatus according to claim 1, wherein
the anchor member is made from an elastic material.

5. The apparatus according to claim 1, wherein
the push-up member is nearer to a second end surface of the two end surfaces of the storage section with respect to a center in a longitudinal direction of the storage section.

6. The apparatus according to claim 1, wherein:
the cradle includes a first support member protruding from the bottom surface of the storage section, the first support member being configured to support the electronic terminal at a position above the bottom surface of the storage section; and
the first support member is between the push-up member and the cord insertion portion in a longitudinal direction of the storage section.

7. The apparatus according to claim 1, further comprising:
a cord reel including an opening positioned below the cord insertion portion, the cord reel being configured to store the cord of the electronic terminal extendably and retractably through the opening; and
a cord reel holder on which the cord reel is attachable.

8. The apparatus according to claim 7, wherein
the cord reel holder is connected to a lower portion of the side of the first end surface of the two end surfaces of the storage section.

9. The apparatus according to claim 1, wherein
the cradle further includes:
a locking claw on a side of a second end surface of the two end surfaces of the storage section, the locking claw being capable of engaging with a first end of the electronic terminal when the electronic terminal is stored in the storage section; and
an operation portion connected to the locking claw, the locking claw configured to be engaged and disengaged to and from the first end of the electronic terminal by operating the locking claw.

10. The apparatus according to claim 1, wherein
the push-up member includes an elastic member for urging a bottom of the electronic terminal when the electronic terminal is stored in the storage section.

11. The apparatus according to claim 1, wherein
both sides of the electronic terminal along the longitudinal direction each include a first inclined surface facing upward and a second inclined surface facing downward.

12. The apparatus according to claim 11, wherein:
the cradle further includes an anchor member on or below top edges of the two side surfaces of the storage section, the anchor member protruding inward from the two side surfaces of the storage section into the storage section, the anchor member being configured to hold both of the sides of the electronic terminal along the longitudinal direction when the electronic terminal is stored in the storage section;

the anchor member includes a pair of third inclined surfaces facing downward;

the first inclined surface of a first of the sides of the electronic terminal along the longitudinal direction is configured to abut against the third inclined surface a first of the pair of third inclined surfaces of the anchor member before and after the push-up member projects and the electronic terminal pivots; and the first inclined surface of a second of the sides of the electronic terminal along the longitudinal direction is configured to abut against a second of the pair of third inclined surfaces of the anchor member before and after the push-up member projects and the electronic terminal pivots.

13. An apparatus comprising:

an electronic terminal; and a cradle configured to removably hold the electronic terminal, wherein the cradle includes:

a main body having a longitudinal direction;

a storage section in the main body, the storage section including a recess defined by a bottom surface, two side surfaces extending along the longitudinal direction, and two end surfaces extending along a lateral direction that crosses the longitudinal direction, the storage section being capable of accommodating an entire length of the electronic terminal;

a cord insertion portion that is open at a first end surface of the two end surfaces of the storage section, the cord insertion portion being configured to receive a cord of the electronic terminal therethrough;

a push-up member configured to retractably project from the bottom surface of the storage section, and configured to abut against the electronic terminal when the electronic terminal is stored in the storage section; and a support member between the push-up member and a second end surface of the two end surfaces of the storage section in a longitudinal direction of the storage section, the support member protruding from the bottom surface of the storage section, the support member being configured to support the electronic terminal at a position above the bottom surface of the storage section, wherein the electronic terminal is configured to be stored in the storage section such that a space is defined between the electronic terminal and the bottom surface of the storage section, the electronic terminal being capable of pivoting to a side of the first end surface of the two end surfaces of the storage section due to the push-up member projecting.

* * * * *